US011121119B2

(12) United States Patent
Chen et al.

(10) Patent No.: US 11,121,119 B2
(45) Date of Patent: Sep. 14, 2021

(54) SEMICONDUCTOR PACKAGE

(71) Applicant: Powerchip Semiconductor Manufacturing Corporation, Hsinchu (TW)

(72) Inventors: Chun-Liang Chen, Hsinchu County (TW); Hann-Jye Hsu, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 30 days.

(21) Appl. No.: 16/777,903

(22) Filed: Jan. 31, 2020

(65) Prior Publication Data

US 2020/0312813 A1 Oct. 1, 2020

(30) Foreign Application Priority Data

Mar. 27, 2019 (TW) ................................ 108110759
Nov. 28, 2019 (TW) ................................ 108143316

(51) Int. Cl.
*H01L 23/52* (2006.01)
*H01L 25/065* (2006.01)
(Continued)

(52) U.S. Cl.
CPC ...... *H01L 25/0655* (2013.01); *H01L 23/5387* (2013.01); *H01L 24/05* (2013.01);
(Continued)

(58) Field of Classification Search
CPC ..... H01L 24/32; H01L 24/05; H01L 23/5387; H01L 25/0655; H01L 27/3276;
(Continued)

(56) References Cited

U.S. PATENT DOCUMENTS 7,649,246 B2 * 1/2010 Chung ................ H01L 23/4985 257/668
7,915,727 B2 * 3/2011 Choi .................... H05K 1/0203 257/702
(Continued)

FOREIGN PATENT DOCUMENTS

CN 101399247 4/2009
TW 201640632 11/2016

OTHER PUBLICATIONS

"Office Action of Taiwan Counterpart Application", dated Dec. 7, 2020, p. 1-p. 6.

*Primary Examiner* — Luan C Thai
(74) *Attorney, Agent, or Firm* — JCIPRNET

(57) ABSTRACT

The present disclosure provides a semiconductor package including a substrate, a display unit, a flexible substrate, a driving circuit, and a memory. The substrate has a first surface and a second surface opposite to each other, and the first surface has a display region and a bonding region. The display unit is disposed on the display region of the first surface. The flexible substrate is disposed below the second surface and has a connection portion extended to the bonding region of the first surface. The driving circuit is disposed on the flexible substrate and electrically connects with the display unit. The memory is disposed on the flexible substrate and electrically connects with the driving circuit.

8 Claims, 3 Drawing Sheets

(51) Int. Cl.
*H01L 23/00* (2006.01)
*H01L 23/538* (2006.01)

(52) U.S. Cl.
CPC ................. *H01L 2924/1436* (2013.01); *H01L 2924/1437* (2013.01); *H01L 2924/14511* (2013.01)

(58) Field of Classification Search
CPC .. G09G 3/2092; G02F 1/13452; H05K 1/189; H05K 2201/10136; H05K 2201/10159; H05K 2201/056
See application file for complete search history.

(56) References Cited

U.S. PATENT DOCUMENTS

| | | | | |
|---|---|---|---|---|
| 8,269,923 | B2 * | 9/2012 | Yamagishi | G02F 1/1345 349/74 |
| 9,516,749 | B2 | 12/2016 | Wada et al. | |
| 2004/0252086 | A1 * | 12/2004 | Matsuda | G09G 3/3216 345/76 |
| 2014/0153266 | A1 | 6/2014 | Kim | |
| 2018/0336818 | A1 * | 11/2018 | Zheng | G02F 1/13452 |

* cited by examiner

SEMICONDUCTOR PACKAGE

CROSS-REFERENCE TO RELATED APPLICATION

This application claims the priority benefits of Taiwan application serial no. 108110759, filed on Mar. 27, 2019 and Taiwan application serial no. 108143316, filed on Nov. 28, 2019. The entirety of each of the above-mentioned patent applications is hereby incorporated by reference herein and made a part of this specification.

BACKGROUND OF THE INVENTION

1. Field of the Invention

The invention relates to a package structure, and more particularly, to a semiconductor package.

2. Description of Related Art

With the development of display technology, the requirement for a driver with high-integration IC that capable of driving a display unit through connection (also referred to as a driver IC) is increased. Therefore, various semiconductor packages have been developed to meet the above requirement. In general, a common semiconductor package for driving the display unit may be, for example, a chip on glass (COG), a tape carrier package (TCP), or a chip on film (COF). The TCP and COF can make the display to have a narrow border design as compared to the COG, so it is commonly used to the semiconductor package for driving the display unit. However, as the demand for the drivers to have small size and/or high operation speeds is increased, the TCP has been gradually replaced by the COF due to its circuit pitch and bonding pitch being inferior to the COF.

Recently, as the users require higher display quality (e.g. image resolution, color saturation, and the like), the data to be processed by the driver is increased. As such, a defect (e.g. mura) may be occurred due to the image delay caused by the time required to process the data is too long.

SUMMARY OF THE INVENTION

The invention provides a semiconductor package that can have high operation speed, low power consumption, and good process flexibility.

An embodiment of the invention provides a semiconductor package including a substrate, a display unit, a flexible substrate, a driving circuit, and a memory. The substrate has a first surface and a second surface opposite to each other, and the first surface has a display region and a bonding region. The display unit is disposed on the display region of the first surface. The flexible substrate is disposed below the second surface and has a connection portion extended to the bonding region of the first surface. The driving circuit is disposed on the flexible substrate and electrically connects with the display unit. The memory is disposed on the flexible substrate and electrically connects with the driving circuit.

According to an embodiment of the invention, in the semiconductor package, the driving circuit and the memory are spaced apart from each other.

According to an embodiment of the invention, in the semiconductor package, the flexible substrate has a wiring structure, and the memory is electrically connected with the driving circuit through the wiring structure.

According to an embodiment of the invention, in the semiconductor package, the memory is electrically connected with the driving circuit through a mobile industry processor interface (MIPI).

According to an embodiment of the invention, in the semiconductor package, the memory is disposed on the driving circuit.

According to an embodiment of the invention, in the semiconductor package, the display unit overlaps with the driving circuit and the memory in a vertical projection direction of the substrate.

According to an embodiment of the invention, in the semiconductor package, the connection portion includes a connection pad electrically connected with a pad in the bonding region.

According to an embodiment of the invention, the semiconductor package further includes a conductive layer disposed between the connection pad and the pad.

According to an embodiment of the invention, the semiconductor package further includes a circuit board disposed on the flexible substrate and electrically connected with the driving circuit.

According to an embodiment of the invention, in the semiconductor package, the circuit board is electrically connected with the memory.

According to an embodiment of the invention, the semiconductor package further includes a control circuit disposed on the flexible substrate and electrically connected with the driving circuit and the circuit board respectively.

According to an embodiment of the invention, in the semiconductor package, the driving circuit includes a source driving circuit.

According to an embodiment of the invention, in the semiconductor package, the memory includes a static random access memory (SRAM), pseudo-SRAM, dynamic random access memory (DRAM), a flash memory, an electrically erasable and programmable read only memory (EEPROM), or a combination thereof.

According to an embodiment of the invention, in the semiconductor package, the display unit comprises a liquid crystal display (LCD), an organic light emitting diode (OLED), Mini-LED display, or Micro-LED display.

Based on the above, the memory and the driving circuit of the semiconductor package of the present invention are electrically connected to each other and disposed on the flexible substrate, so that the driving circuit can handle a large amount of image data. As a result, the semiconductor package may have characteristics of high operation speed and low power consumption so as to meet the frame rate requirement of the display unit having high resolution and high quality.

On the other hand, since the driving circuit and the memory may be separately manufactured through different processes and then respectively disposed on the flexible substrate, the semiconductor package may have good process flexibility in the case where the processes of the driving circuit and the memory are separated.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

Figure 1:
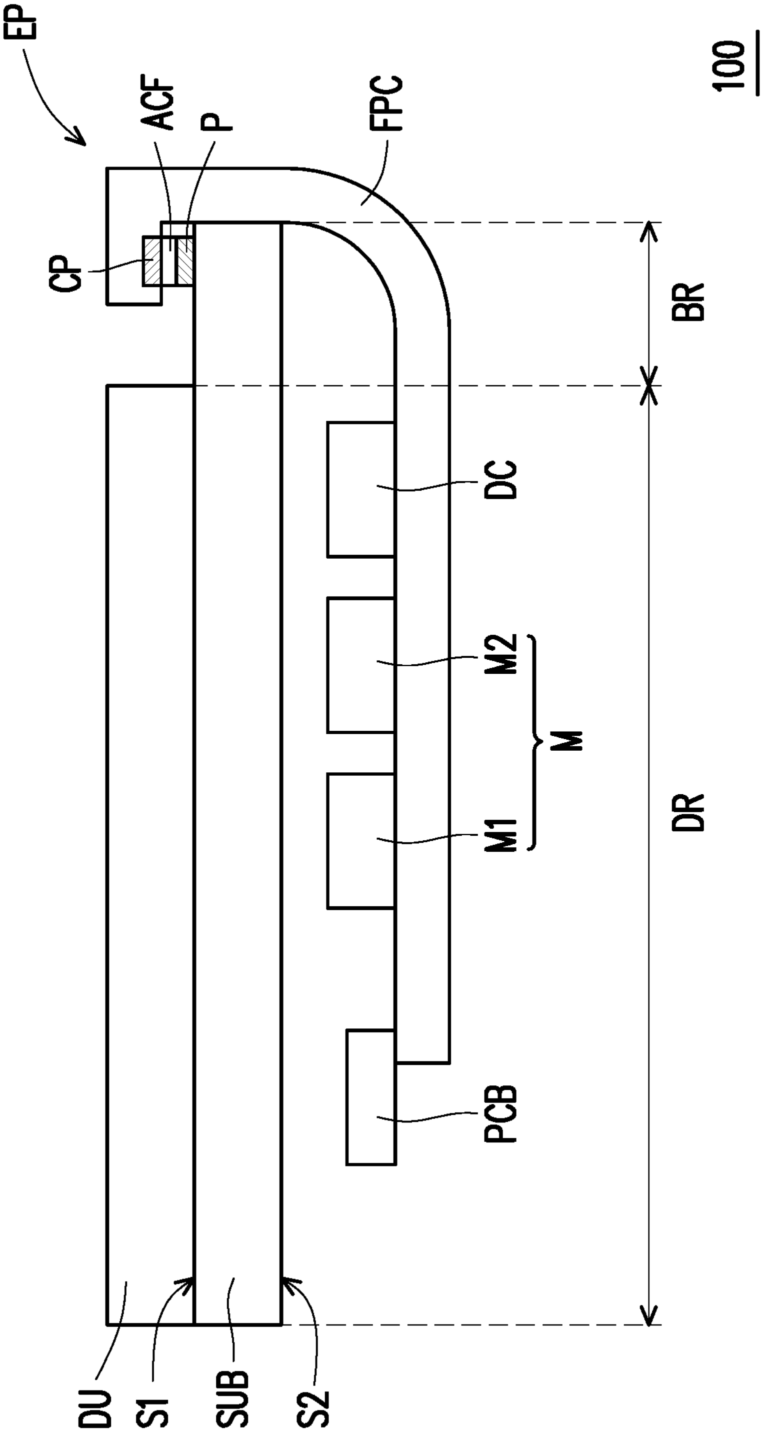
FIG. 1 is a cross-sectional view of the semiconductor package in an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection). For example, the electrical connection may include a general connection of wired connection as described above, or an interface connection through MIPI.

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 2:
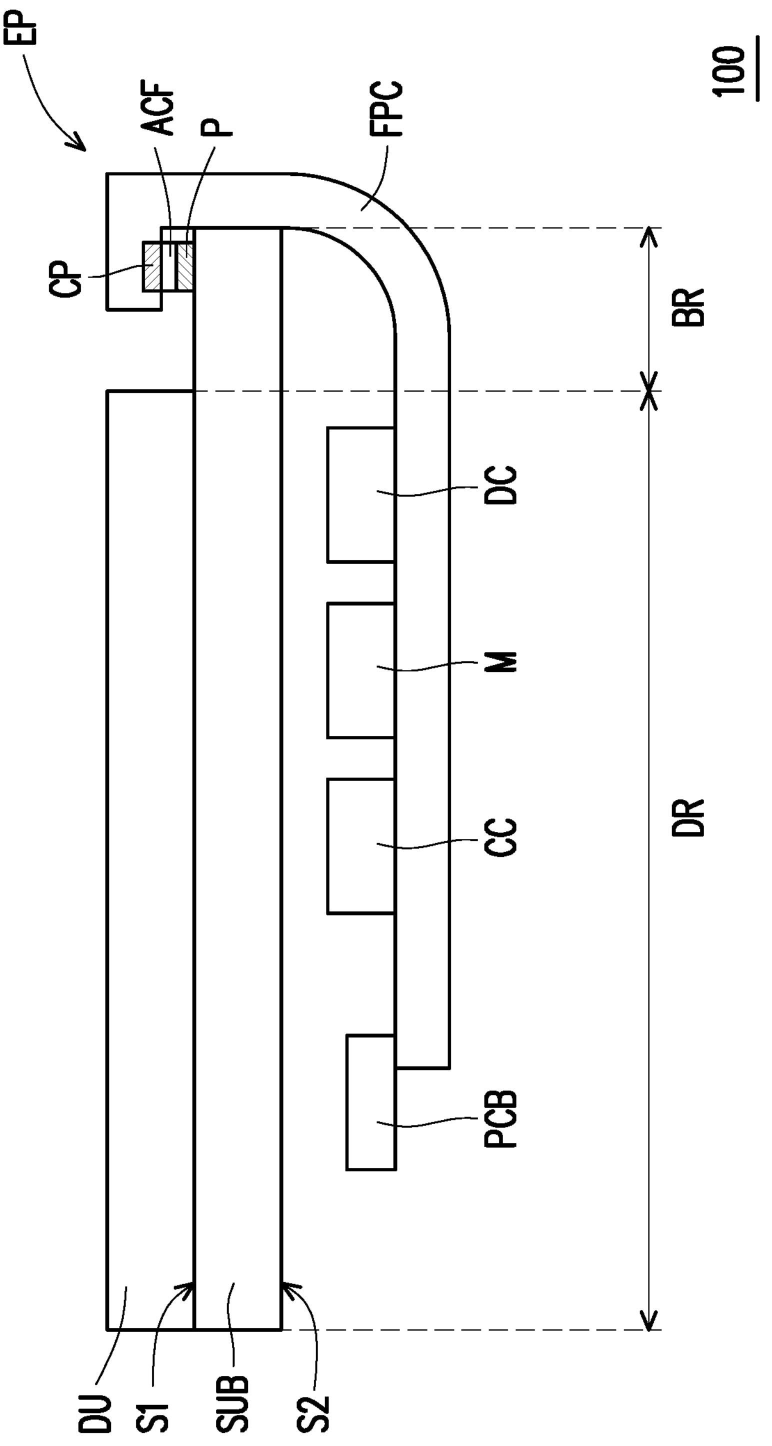
FIG. 2 is a cross-sectional view of the semiconductor package in another embodiment of the invention.
Figure 3:
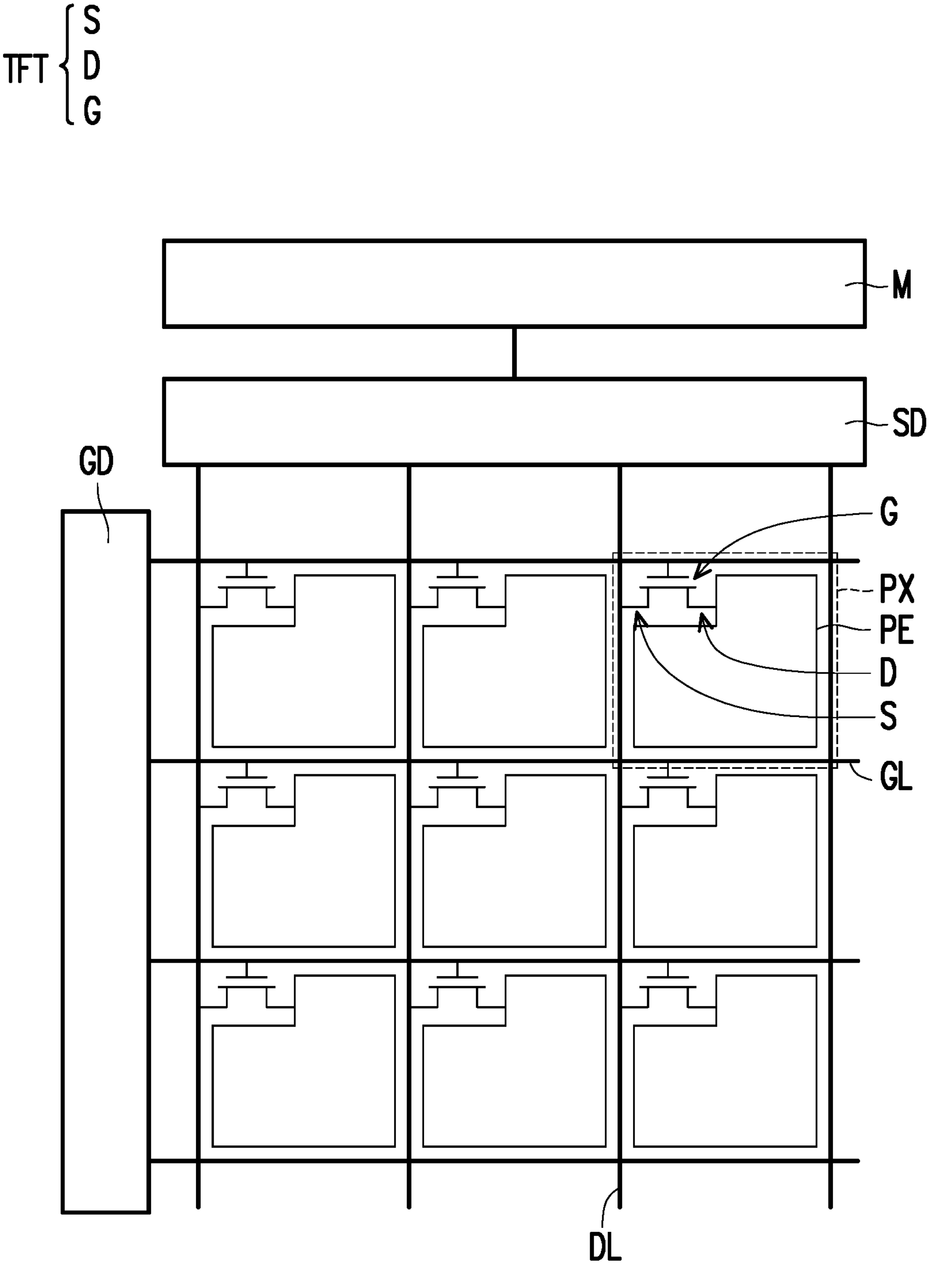
FIG. 3 is a schematic diagram illustrating the signal connection of the driving circuit, memory, and display unit of the semiconductor package in an embodiment of the invention.

FIG. 1 is a cross-sectional view of the semiconductor package in an embodiment of the invention. FIG. 2 is a cross-sectional view of the semiconductor package in another embodiment of the invention. FIG. 3 is a schematic diagram illustrating the signal connection of the driving circuit, memory, and display unit of the semiconductor package in an embodiment of the invention.

Referring to FIG. 1, a semiconductor package 100 includes a substrate SUB, a display unit DU, a flexible substrate FPC, a driving circuit DC, and a memory M.

The substrate SUB has a first surface S1 and a second surface S2 opposite to each other, and the first surface S1 has a display region DR and a bonding region BR. The substrate SUB may be a rigid substrate or a flexible substrate. For instance, the substrate SUB may be glass, quartz, organic polymer, or other suitable materials.

The display unit DU is disposed on the display region DR of the first surface S1. In the present embodiment, the display unit DU may include a liquid crystal display (LCD), an organic light emitting diode (OLED), Mini-LED display, or Micro-LED display. In the present embodiment, the display unit DU is described as an exemplary embodiment of the liquid crystal display, but the invention is not limited thereto. For instance, referring to both FIG. 1 and FIG. 3, the display unit DU may include a plurality of sub-pixels PX arranged on the substrate SUB in an array and a plurality of signal lines GL, DL interlaced with each other. In the present embodiment, each of the sub-pixels PX may include an active element TFT and a pixel electrode PE. The active element TFT may include a gate G, a source S, and a drain D, wherein the gate G may be electrically connected with the corresponding signal line GL (e.g., a gate line); and the source S may be electrically connected with the corresponding signal line DL (e.g., a data line); and the drain D may be electrically connected with the corresponding pixel electrode PE. The active element TFT may be a bottom-gate type transistor, a top-gate type transistor, or other suitable transistor. In some embodiments, the pixel electrode PE may optionally include a plurality of slits (not shown) having different extending directions or a plurality of slits having substantially the same extending direction, but the invention is not limited thereto.

The flexible substrate FPC is disposed below the second surface S2 (In other words, the flexible substrate FPC is disposed on the second surface S2) and has a connection portion EP extending to the bonding region BR of the first surface S1. The material of the flexible substrate FPC may include polyimide (PI). In the present embodiment, the connection portion EP may include a connection pad CP. The connection pad CP is electrically connected with a pad P in the bonding region BR; and the pad P is electrically connected with the active element TFT in the display unit DU. For instance, the pad P may be electrically connected with the source S of the active element TFT. The material of the connection pad CP may be a conductive material such as a metal, a metal oxide, or a combination thereof. The material of the pad P may be a conductive material such as a metal, a metal oxide, or a combination thereof.

In some embodiments, the semiconductor package 100 may optionally include a conductive layer ACF. The conductive layer ACF is disposed between the connection pad CP and the pad P, so that the connection pad CP may be electrically connected with the pad P through the conductive layer ACF. The conductive layer ACF may be a conductive bump, a conductive paste, a solder, or a combination thereof. For example, the conductive layer ACF may be an anisotropic conductive film (ACF).

The driving circuit DC is disposed on the flexible substrate FPC and electrically connected with the display unit DU, and the memory M is disposed on the flexible substrate FPC and electrically connected with the driving circuit DC. As such, the memory M may serve as a frame buffer to store the image data temporarily, so that the driving circuit DC (e.g., the source driving circuit SD) are capable of handling a large amount of image data from a micro control unit (MCU) or a micro control unit integrated dynamic random access memory (MCU/DRAM). As a result, the semiconductor package 100 may have characteristics of high operation speed and low power consumption so as to meet the frame rate requirement of the display unit DU having high resolution and high quality. In the present embodiment, the driving circuit DC and the memory M may be spaced apart from each other. In some embodiments, the flexible substrate FPC may have a wiring structure, and the memory M may be electrically connected with the driving circuit DC through the wiring structure, but the invention is not limited thereto. In another some embodiments, the memory M may be electrically connected with the driving circuit DC through the MIPI. In some embodiments, the memory M may be disposed on the driving circuit DC. The driving circuit DC may include a source driving circuit SD. The source driving circuit SD may be electrically connected with the source S of the active element TFT through the signal line DL. In some embodiments, the semiconductor package 100 may further include a gate driving circuit GD. The gate driving circuit GD may be electrically connected with the gate G of the active element TFT through the signal line GL. The memory M may include a static random access memory (SRAM), pseudo-SRAM, dynamic random access memory (DRAM), a flash memory (Flash), an electronic erasable programmable read only memory (EEPROM), or a combination thereof. It should be noted that, FIG. 1 illustrates a semiconductor package with two memories M1 and M2 as an exemplary embodiment to clearly describe the invention, but the invention is not limited thereto. In other embodiments, the amount of the memory M may be 1 or larger than 2.

On the other hand, since the memory M and the driving circuit DC are both disposed on the flexible substrate FPC, additional bus lines for connecting the driving circuit DC to the external memory element is not required. As a result, the transmission speed of image data is enhanced and the process for manufacturing the semiconductor package is simplified. For example, the memory M is electrically connected with the driving circuit DC through the flexible substrate FPC.

In addition, the driving circuit DC is a kind of high-voltage semiconductor elements; and the operating voltage of the memory M is similar to the voltage of the general logic circuit, so the driving circuit DC and the memory M may have different limitations in the process design requirements. Therefore, the integration of these two processes may have a certain degree of difficulty. In the present embodiment, the driving circuit DC and the memory M may be separately manufactured through different processes, and then respectively disposed on the flexible substrate. As such, in this kind of the semiconductor package where the manufacturing processes of the driving circuit DC and the memory M can be separated, both of the driving circuit DC and the memory M may have good process flexibility.

In some embodiments, the narrow border design may be achieved by disposing the driving circuit DC and the memory M on the flexible substrate FPC located on the rear side of the substrate SUB (i.e., the second surface S2). In other words, in the vertical projection direction of the substrate SUB, the display unit DU may overlap with the driving circuit DC and the memory M.

In the present embodiment, the semiconductor package 100 may include a circuit board PCB disposed on the flexible substrate FPC and electrically connected to the driving circuit DC and/or memory M. That is, the circuit board PCB may serve as an element that connecting a signal from a main board to the driving circuit DC and/or memory M of the flexible substrate FPC. The circuit board PCB may be, for example, a printed circuit board (PCB) or a flexible printed circuit board (FPCB).

Referring to FIG. 2, the semiconductor package 100 may optionally include a control circuit CC. In the present embodiment, the control circuit CC may be disposed on the flexible substrate and electrically connected with the driving circuit DC and the circuit board PCB respectively. In some embodiments, the control circuit CC may be electrically connected with the driving circuit DC and the circuit board PCB through the wiring structure of the flexible substrate FPC, but the invention is not limited thereto. In another some embodiments, the control circuit may be electrically connected with the driving circuit DC and the circuit board PCB through MIPI. In the present embodiment, the control circuit CC may include a digital (logical) integrated circuit or an analog integrated circuit. It should be noted that, FIG. 2 illustrates a semiconductor package with one control circuit CC as an exemplary embodiment to clearly describe the invention, but the invention is not limited thereto. In other embodiments, the control circuit CC may be plural.

In summary, the memory and the driving circuit of the semiconductor package of the present embodiment are electrically connected to each other and disposed on the flexible substrate, so that the driving circuit is capable of handling a large amount of image data. As a result, the semiconductor package may have characteristics of high operation speed and low power consumption so as to meet the frame rate requirement of the display unit having high resolution and high quality. In particular, the functions of the mobile devices are becoming more and more diverse, and the interconnection interfaces between the chips and peripheral components are more complicated, therefore, the interface connection as described above is relatively importance. When developing mobile devices and network communication equipment, the interfaces between the chips disposed in the smart phones and tablets are usually incompatible, such that the signals of the interface circuit have to undergo multiple conversions, which not only increases the cost, but also reduces the transmission efficiency of the chip, thereby the RF wireless communication transmission performance of the network communication equipment may be directly affected. As such, the interface connection of MIPI as described above has become the mainstream of the modern mobile product design.

Based on the specification requirements of the MIPI promoted by the MIPI Alliance, the product developers may not only enhance the integrated design of the connections of the internal chips in the device, but also reduce the complexity of the integrated wirings of the chip and save the number of interface conversion components through the standardized interface, thereby the cost of the semi-finished product can be reduced and the time course of product development can be accelerated. Through the standard interface of the specification, the function module of the smart device can be used to meet the mainstream high-speed transmission interface of the market, and thus the integration of the function can be proceeded.

On the other hand, since the driving circuit and the memory may be separately manufactured through different processes and then respectively disposed on the flexible substrate, the semiconductor package may have good process flexibility in the case where the processes of the driving circuit and the memory are separated.

It will be apparent to those skilled in the art that various modifications and variations can be made to the disclosed embodiments. It is intended that the specification and examples be considered as exemplary only, with a true scope of the disclosure being indicated by the following claims and their equivalents.

What is claimed is:

1. A semiconductor package, comprising:

a substrate having a first surface and a second surface opposite to each other, and the first surface has a display region and a bonding region;

a display unit disposed on the display region of the first surface;

a flexible substrate disposed below the second surface and having a connection portion extended to the bonding region of the first surface;

a driving circuit directly disposed on the flexible substrate and electrically connected with the display unit;

a memory directly disposed on the flexible substrate and spaced apart from and electrically connected to the driving circuit;

a circuit board disposed on the flexible substrate and electrically connected to the driving circuit and the memory, respectively; and a control circuit disposed on the flexible substrate and electrically connected to the driving circuit and the circuit board, respectively, wherein the display unit overlaps with the driving circuit, the memory, and the control circuit in a direction perpendicular to the first surface of the substrate.

2. The semiconductor package to claim 1, wherein the flexible substrate has a wiring structure, and the memory is electrically connected to the driving circuit through the wiring structure.

3. The semiconductor package to claim 1, wherein the memory is electrically connected to the driving circuit through a mobile industry processor interface (MIPI).

4. The semiconductor package according to claim 1, wherein the connection portion comprises a connection pad, and the connection pad is electrically connected to a pad in the bonding region.

5. The semiconductor package according to claim 4, further comprising:

a conductive layer disposed between the connection pad and the pad.

6. The semiconductor package according to claim 1, wherein the driving circuit comprises a source driving circuit.

7. The semiconductor package according to claim 1, wherein the memory comprises a static random access memory (SRAM), pseudo-SRAM, dynamic random access memory (DRAM), a flash memory, an electrically erasable and programmable read only memory (EEPROM), or a combination thereof.

8. The semiconductor package according to claim 1, wherein the display unit comprises a liquid crystal display (LCD), an organic light emitting diode (OLED), Mini-LED display, or Micro-LED display.

* * * * *